(12) United States Patent
Hisamatsu (10) Patent No.: US 8,035,717 B2
(45) Date of Patent: Oct. 11, 2011

(54) SOLID-STATE IMAGE PICKUP DEVICE AND CAMERA SYSTEM (75) Inventor: Yasuaki Hisamatsu, Kanagawa (JP)

(73) Assignee: Sony Corporation, Tokyo (JP)

(*) Notice: Subject to any disclaimer, the term of this patent is extended or adjusted under 35 U.S.C. 154(b) by 334 days.

(21) Appl. No.: 12/470,636

(22) Filed: May 22, 2009

(65) Prior Publication Data
US 2009/0278969 A1 Nov. 12, 2009

Related U.S. Application Data (63) Continuation-in-part of application No. PCT/JP2008/067152, filed on Sep. 24, 2008.

(30) Foreign Application Priority Data

Sep. 28, 2007 (JP) ................................. 2007-256377

(51) Int. Cl.
H04N 3/14 (2006.01)
(52) U.S. Cl. ........................ 348/308; 348/302; 348/572
(58) Field of Classification Search ........................ None
See application file for complete search history.

(56) References Cited

U.S. PATENT DOCUMENTS

| 7,088,279 | B2 | 8/2006 | Muramatsu et al. | |
| 7,315,273 | B2 | 1/2008 | Muramatsu et al. | |
| 2008/0284886 | A1* | 11/2008 | Wakabayashi et al. | 348/301 |
| 2011/0025900 | A1* | 2/2011 | Kondo | 348/308 |

FOREIGN PATENT DOCUMENTS

| JP | 2002-027331 | 1/2002 |
| JP | 2005-303648 | 10/2005 |
| JP | 2005-323331 | 11/2005 |
| JP | 2006-080861 | 3/2006 |
| JP | 2006-303752 | 11/2006 |

OTHER PUBLICATIONS

International Search Report dated Dec. 22, 2008.

* cited by examiner

Primary Examiner — Jason Chan
Assistant Examiner — Yih-Sien Kao
(74) Attorney, Agent, or Firm — SNR Denton US LLP

(57) ABSTRACT

A solid-state image pickup device and a camera system in which: (1) counters are organized into a counter group and a memory group on a column-by-column basis; (2) in each column, the individual counters are cascade-connected between individual bits; (3) switches are provided at bit output portions of the individual counters; (4) connecting sides of the individual switches are commonly connected to a column-signal transfer line, and output sides of the switches are shared with the other individual bits; (5) inputs of memories (latch circuits), which store digital data for horizontal transfer, share the column-signal transfer line; and (6) outputs of the memories corresponding to the individual bits are connected via switches to data transfer signal lines wired so as to be orthogonal to the column-signal transfer line.

8 Claims, 11 Drawing Sheets

SOLID-STATE IMAGE PICKUP DEVICE AND CAMERA SYSTEM

RELATED APPLICATION DATA

This application is a continuation-in-part of PCT International Application No. PCT/JP2008/067152, filed in the Japanese Patent Office on Sep. 24, 2008, the entirety of which is incorporated herein by reference to the extent permitted by law. The present application also claims priority to Japanese Patent Application No. 2007-256377, filed in the Japanese Patent Office on Sep. 28, 2007, the entirety of which is incorporated by reference herein to the extent permitted by law.

BACKGROUND OF THE INVENTION

The present invention relates to solid-state image pickup devices represented by CMOS image sensors, and to camera systems.

In recent years, CMOS image sensors have been attracting attention as solid-state image pickup devices (images sensors), in place of CCDs.

This is because CMOS image sensors overcome problems including that a dedicated manufacturing process is necessary for fabricating CCD pixels, a plurality of power supply voltages are necessary for the operation thereof, and a system becomes very complicated due to the necessity of a plurality of peripheral ICs to be operated in a combined manner.

CMOS image sensors can be manufactured using a manufacturing process similar to the process of manufacturing general CMOS ICs. Also, a CMOS image sensor can be driven by a single power supply. Furthermore, an analog circuit and a logic circuit using CMOS processes can be mixed in a single chip, resulting in a reduction of the number of peripheral ICs. That is, CMOS sensors have multiple advantages.

An output circuit of a CCD is generally a 1-channel (ch) output using an FD amplifier with a floating diffusion layer (FD: Floating Diffusion).

In contrast, a CMOS image sensor has an FD amplifier in each pixel and generally uses a column-parallel output scheme that selects a row from an array of pixels and simultaneously reads and outputs signals from the pixels in the selected row in a column direction.

Because it is difficult to obtain sufficient drive power using the FD amplifiers arranged in the pixels, the data rate is necessary to be dropped. In this sense, parallel processing is regarded to be advantageous.

In solid-state image pickup apparatuses represented by CCD and CMOS image sensors, miniaturization is further carried out because of a further increase in the number of pixels. In parallel to this, high-speed signal reading processing is required.

As means for realizing high-speed reading in a CMOS image sensor, pixels arranged two-dimensionally are configured to share signal reading lines in a vertical direction. Additionally, reading circuits are provided for individual columns, and, by driving them at the same time, simultaneous signal processing corresponding to the total number of columns is performed.

Also, generally in analog signal processing, high-speed processing and low-noise processing contradict each other. Thus, high-speed analog signal processing has problems that may lead to image quality degradation.

In contrast, the above-described reading circuits for the individual columns perform processing up to analog-to-digital conversion. Processing of items of column data corresponding to one to a few buses becomes digital signal processing, whereby significantly high-speed processing and a noise-robust circuit can be realized.

Various types of signal output circuits in column-parallel-output CMOS image sensors have been proposed. One of the most advanced types is the type that includes an analog-to-digital converter (hereinafter abbreviated as ADC (Analog digital converter)) in each column, and that obtains a pixel signal as a digital signal.

A CMOS image sensor with column-parallel ADCs is disclosed in, for example, W. Yang, et al. (W. Yang et al., "An Integrated 800×600 CMOS Image System," ISSCC Digest of Technical Papers, pp. 304-305, February, 1999), and in Japanese Unexamined Patent Application Publication No. 2005-303648 and Japanese Unexamined Patent Application Publication No. 2005-323331.

Figure 1:
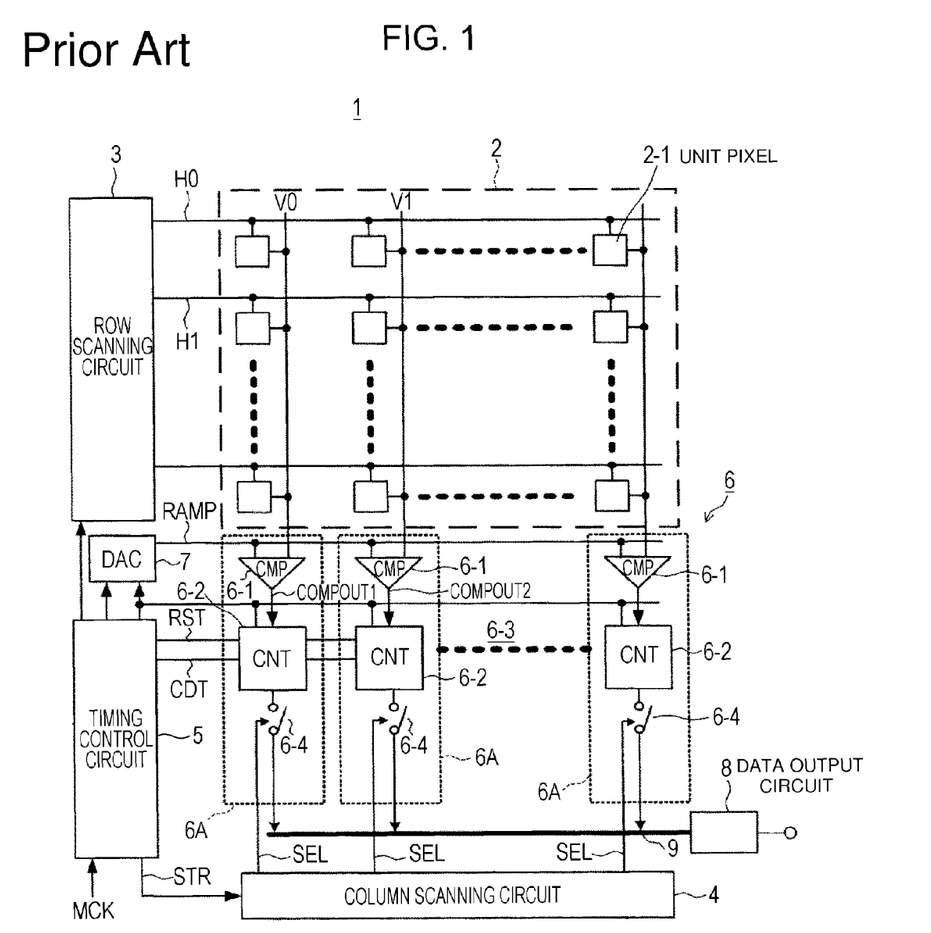
FIG. 1 is a block diagram illustrating a structure example of a solid-state image pickup device (CMOS image sensor) with column-parallel ADCs.

FIG. 1 is a block diagram illustrating a structure example of a solid-state image pickup device (CMOS image sensor) with column-parallel ADCs.

This solid-state image pickup device 1 includes a pixel array section 2 serving as an image pickup unit, a row scanning circuit 3, a column scanning circuit 4, a timing control circuit 5, an ADC group 6, a digital-to-analog converter (hereinafter abbreviated as DAC (Digital-Analog converter) 7, and a data output circuit 8 including a sense amplifier circuit (S/A).

The pixel array section 2 is configured by arranging unit pixels 2-1, each including a photodiode and an intra-pixel amplifier, arranged in a matrix.

Also, in the solid-state image pickup device 1, the timing control circuit 5 for generating an internal clock, the row scanning circuit 3 for controlling row addresses and row scanning, and the column scanning circuit 4 for controlling column addresses and column scanning are arranged as control circuits for sequentially reading signals from the pixel array section 2.

The ADC group 6 includes ADCs 6A arranged for individual column lines V0, V1, ... in a manner correlated with the individual columns of the pixel matrix. The ADCs 6A include (n+1) comparators 6-1 each of which compares a ramp waveform RAMP, which is obtained by changing a reference voltage generated by the DAC 7, which serves as a reference-voltage generating circuit, to be a stepped voltage, with an analog signal obtained for each row line H0, H1, ... from unit pixels 2-1 through the column line V0, V1, ..., asynchronous up/down counters (hereinafter called counters) 6-2 each of which performs counting up (or counting down) in response to an output of a corresponding one of the comparators 6-1 and a clock CK and includes a memory (latch) 6-5 that holds a count value, the memories (latches) 6-5 (illustrated in FIG. 2) that hold count values of the counters 6-2, and switches 6-4 selectively making connections between outputs of the counters 6-2 and the memories 6-5 in response to a signal SEL. Accordingly, a column-parallel ADC block 6-3 is configured.

Outputs of the individual counters 6-2 are connected via the switches 6-4 to a data transfer signal line 9.

The data output circuit (digital-signal processing circuit) 8 including the sense amplifier circuit corresponding to the data transfer signal line 9 and a subtracting circuit is arranged on the data transfer signal line 9.

At an initial time, each counter 6-2 having a function as a holding circuit enters a counting up (or counting down) state, and performs reset counting. When an output COMPOUTi of a corresponding one of the comparators 6-1 is inverted, the counter 6-2 terminates a counting up operation, and the count value is held in the memory 6-5.

On this occasion, the initial value of the counter 6-2 is an arbitrary value of an AD-converted gradation level, such as 0. In this reset counting period, the counter 6-2 reads a reset component ΔV of the unit pixel 2-1.

Thereafter, the counter 6-2 enters a counting down state, and performs data counting in accordance with the intensity of incident light. When the output COMPOUTi of the corresponding comparator 6-1 is inverted, the count value in accordance with a comparison period is held in the memory 6-5.

The count value held in the memory 6-5 is scanned by the column scanning circuit 4 and input as a digital signal to the data output circuit 8 via the data transfer signal line 9.

Here, the operation of the solid-state image pickup device (CMOS image sensor) 1 will be described.

After reading for the first time from the unit pixels 2-1 on an arbitrary row Hx to the column lines V0, V1, . . . becomes stable, the DAC 7 inputs a ramp waveform RAMP, which is obtained by temporally changing a reference voltage to be a stepped voltage, to each comparator 6-1. Comparison with a voltage of an arbitrary column line Vx is performed in a corresponding one of the comparators 6-1.

In parallel to inputting of the stepped wave having the ramp waveform RAMP, each counter 6-2 performs counting for the first time.

Here, an output of the comparator 6-1 is inverted when the RAMP voltage and the Vx voltage become equal. Accordingly, the count operation of the counter 6-2 is terminated, and a count value in accordance with the comparison time is held in the memory 6-5.

At the time of this reading for the first time, the counter 6-2 reads a reset component ΔV of the unit pixel 2-1. In the reset component ΔV, noise differing from one unit pixel 2-1 to another unit pixel 2-1 is included as offset.

However, variations in the reset components ΔV are generally small. Also, since the reset level is common to all pixels, an output of an arbitrary column line Vx is roughly known in advance.

Therefore, at the time of reading the reset component ΔV for the first time, the comparison period can be shortened by adjusting the ramp waveform (RAMP) voltage. In this case, for example, ΔV is compared in a count period (128 clocks) corresponding to 7 bits.

In reading for the second time, besides the reset component ΔV, a signal component in accordance with the intensity of incident light which is different for each unit pixel 2-1 is read, and an operation similar to that in reading for the first time is performed.

That is, after reading for the second time from the unit pixels 2-1 on an arbitrary row Hx to the column lines V0, V1, . . . becomes stable, the DAC 7 inputs a ramp waveform RAMP, which is obtained by temporally changing a reference voltage to be a stepped voltage, to each comparator 6-1. Comparison with a voltage of an arbitrary column line Vx is performed in a corresponding one of the comparators 6-1.

In parallel to inputting of the stepped wave having the ramp waveform RAMP, each counter 6-2 performs counting for the second time.

Here, an output of the comparator 6-1 is inverted when the RAMP voltage and the Vx voltage become equal. At the same time, a count value in accordance with the comparison time is held in the memory 6-5.

On this occasion, the count values obtained in counting for the first time and the second time are held at different places in the memory 6-5.

After the end of the foregoing AD conversion period, with the column scanning circuit 4, n-bit digital signals which are obtained for the first time and the second time and held in the memories 6-5 are transferred via the data transfer signal line 9 and detected at the data output circuit 8. After (signal for the second time)−(signal for the first time) is sequentially performed by the subtracting circuit, the difference is output to the outside. Thereafter, a similar operation is sequentially repeated for the individual rows, and a two-dimensional image is generated.

The foregoing operation is performed in one horizontal unit period (1H).

In 1H, reading for the first time from the unit pixels 2-1 on an arbitrary row Hx to the column lines V0, V1, . . . is denoted by P-phase reading PR; comparison for the first time in the comparators 6-1 is denoted by P-phase comparison PC; reading for the second time is denoted by D-phase reading DR; comparison for the second time in the comparators 6-1 is denoted by D-phase comparison DC; and post-processing after the D-phase processing is denoted by D-phase post-processing DAP. These individual operations are consecutively performed.

Control of timing of the P-phase reading PR, the P-phase comparison PC, the D-phase reading DR, the D-phase comparison DC, and the D-phase post-processing DAP is performed by the timing control circuit 5.

The above-described example is a circuit structure that performs integration-type analog-to-digital conversion processing using counters, comparators, and a reference voltage that is a RAMP wave.

At first, the counters 6-2 each store AD-converted digital data. This is transferred to another digital data storage region, and continuously, the next AD conversion is performed. At the same time, the data moved to the different place is sequentially accessed on a column-by-column basis, and the data is transferred in a horizontal direction and sent to the digital-signal processing circuit.

That is to say, the AD-conversion processing and the horizontal transfer processing are processed in a pipeline manner, whereby high-speed signal reading processing is realized.

The key problem here is the fact that a layout region that can be used for a column reading circuit is limited to the width of a miniature pixel.

Consequently, the reading circuit of each column becomes a vertically very long structure, and, due to the layout constraint, the number of signal lines that can be passed in the vertical direction becomes limited.

Figure 2:
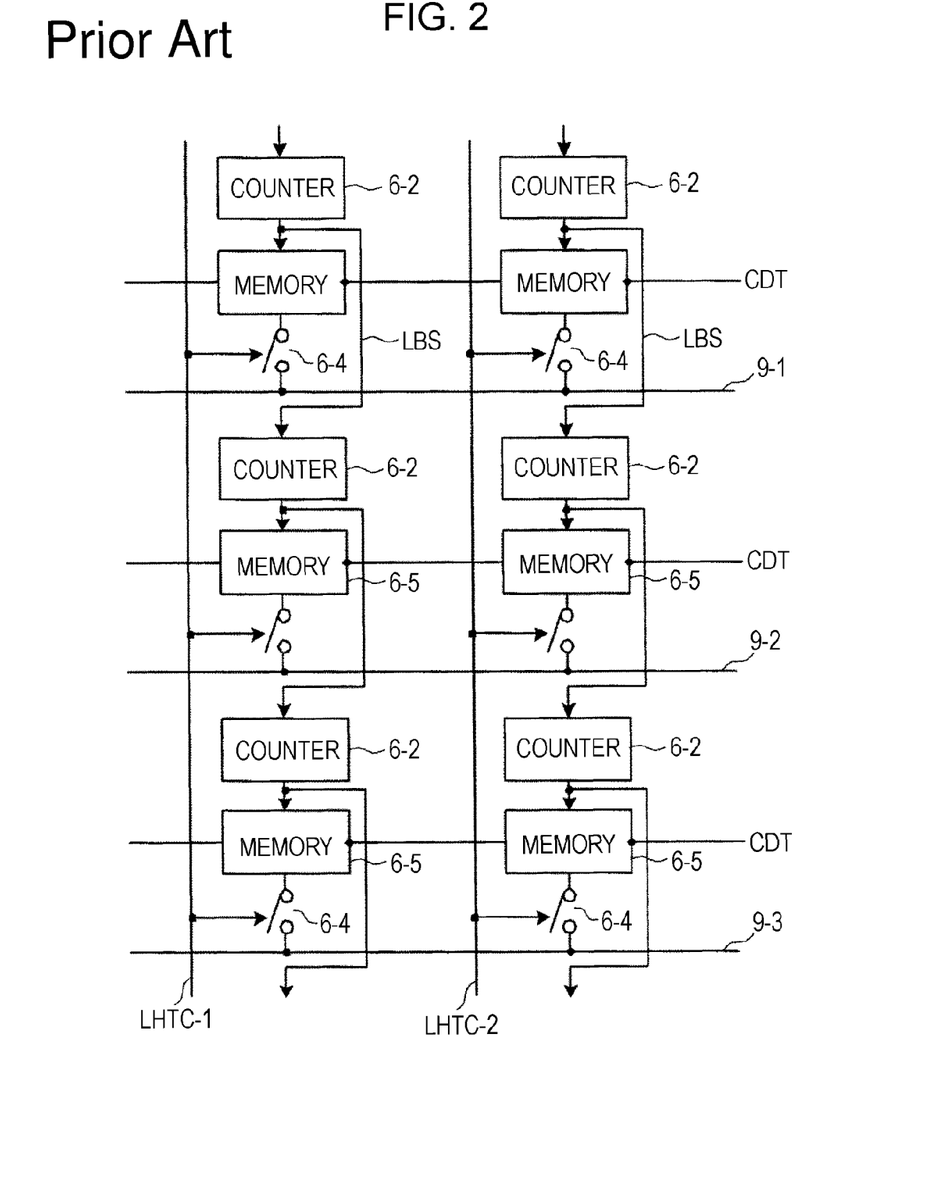
FIG. 2 is a diagram illustrating a layout example of a column reading circuit.

Because of the constraint, when the circuit is laid out, the circuit layout becomes such as that illustrated in FIG. 2.

FIG. 2 is a diagram illustrating a layout example of a column reading circuit.

In FIG. 2, reference numeral 6-5 denotes memories; CDT denotes intra-column data transfer control signals using the timing control circuit 5; and LHTC-1, LHTC-2, . . . denote column-direction (horizontal direction) control lines.

Also, data transfer signal lines 9-1, 9-2, 9-3, . . . are arranged at many stages.

The data storage regions (latch circuits) 6-5 for horizontal transfer are arranged between individual bits of the counters 6-2. Accordingly, each bit data can be closed within each bit. Therefore, a signal line crossing a bit becomes unnecessary, and the number of signal lines in the vertical direction can be suppressed to minimum, whereby a layout within the limited width is realized.

Note that there are disadvantages to this.

Firstly, because the individual bits of the counters 6-2 become distant from each other by a distance corresponding to each data storage region (memory) 6-5 for horizontal transfer (column-direction transfer), a large wiring capacitance and a large wiring resistance are added. This increases the operating current and causes degradation of the operation speed.

A second problem is that signal lines LBS that connect the individual bits of the counters cross the horizontal transfer signal lines LHTC, and driving noise of the counters 6-2 is placed on the data transfer signal lines 9-1, 9-2, 9-3, . . .

Also, whereas the counters 6-2 in each column operate at the same time, because the data transfer signal lines 9 are signal lines shared in the horizontal direction (column direction), all the counter noise in the individual columns is received by the data transfer signal lines 9, which results in serious noise for data transfer.

SUMMARY OF THE INVENTION

The present invention provides a solid-state image pickup device and a camera system that can remove noise causing a data transfer error and that can realize low power consumption driving and high-speed counter operation.

A solid-state image pickup device of a first aspect of the present invention includes a pixel section including a plurality of pixels arranged in a matrix, the plurality of pixels performing photoelectric conversion; and a pixel-signal reading circuit that reads pixel signals from the pixel section in increments of multiple pixels. The pixel-signal reading circuit includes a plurality of comparators arranged in correspondence with columns of the matrix of the pixels, each of the plurality of comparators comparing a read signal potential with a reference voltage and outputting a determination signal obtained thereby; and a plurality of counter latches whose operation is controlled by outputs of the comparators, each of the plurality of counter latches counting a comparison time of a corresponding one of the comparators and including a latch that holds a count value. The counter latches are organized into a counter group and a latch group on a column-by-column basis. In each column, individual counters are cascade-connected between individual bits, and first switches are provided at bit output portions of the individual counters. Connecting sides of the individual first switches are commonly connected to a column-signal transfer line, and output sides of the first switches are shared with other individual bits. Inputs of the latches, which store digital data to be transferred in a column direction, also share the column-signal transfer line. Outputs of the latches corresponding to the individual bits are connected via second switches to data transfer signal lines wired so as to be orthogonal to the column-signal transfer line.

Preferably, the latch group is arranged, by the counter group, on a wiring region side of the data transfer signal lines.

Preferably, the column-signal transfer line is divided into a plurality of segments and shared by the columns.

Preferably, the solid-state image pickup device includes a timing control unit that controls processing performed by the pixel-signal reading circuit. The timing control unit controls turning on/off of the first switches using first data transfer control signals, and controls transfer of data in the latches using second data transfer control signals. A first data transfer control signal for a switch and a second data transfer control signal for a latch, the switch and the latch being connected to output portions of a pair of counters, are supplied at the same timing.

Preferably, the counter group and the latch group are divided into a plurality of groups in the column direction. The timing control unit performs data transfer control using the first data transfer control signals and the second data transfer control signals for each of the divided groups.

Preferably, the counters and the latches are arranged next to each other and are connected to each other on a most significant bit side.

A camera system of a second aspect of the present invention includes a solid-state image pickup device; and an optical system that forms an image of a photographic subject on the solid-state image pickup device. The solid-state image pickup device includes a pixel section including a plurality of pixels arranged in a matrix, the plurality of pixels performing photoelectric conversion; and a pixel-signal reading circuit that reads pixel signals from the pixel section in increments of multiple pixels. The pixel-signal circuit includes a plurality of comparators arranged in correspondence with columns of the matrix of the pixels, each of the plurality of comparators comparing a read signal potential with a reference voltage, and outputting a determination signal obtained thereby; and a plurality of counter latches whose operation is controlled by outputs of the comparators, each of the plurality of counter latches counting a comparison time of a corresponding one of the comparators and including a latch that holds a count value. The counter latches are organized into a counter group and a latch group on a column-by-column basis. In each column, individual counters are cascade-connected between individual bits, and first switches are provided at bit output portions of the individual counters. Connecting sides of the individual first switches are commonly connected to a column-signal transfer line, and output sides of the first switches are shared with other individual bits. Inputs of the latches, which store digital data to be transferred in a column direction, also share the column-signal transfer line. Outputs of the latches corresponding to the individual bits are connected via second switches to data transfer signal lines wired so as to be orthogonal to the column-signal transfer line.

According to the solid-state image pickup device and the camera system of the present invention, noise that causes a data transfer error can be removed, and, what is more, low power consumption driving and high-speed counter operation can be realized.

DETAILED DESCRIPTION OF THE PRESENTLY PREFERRED EMBODIMENTS

An embodiment of the present invention will now herein be described below with reference to the drawings.

Figure 3:
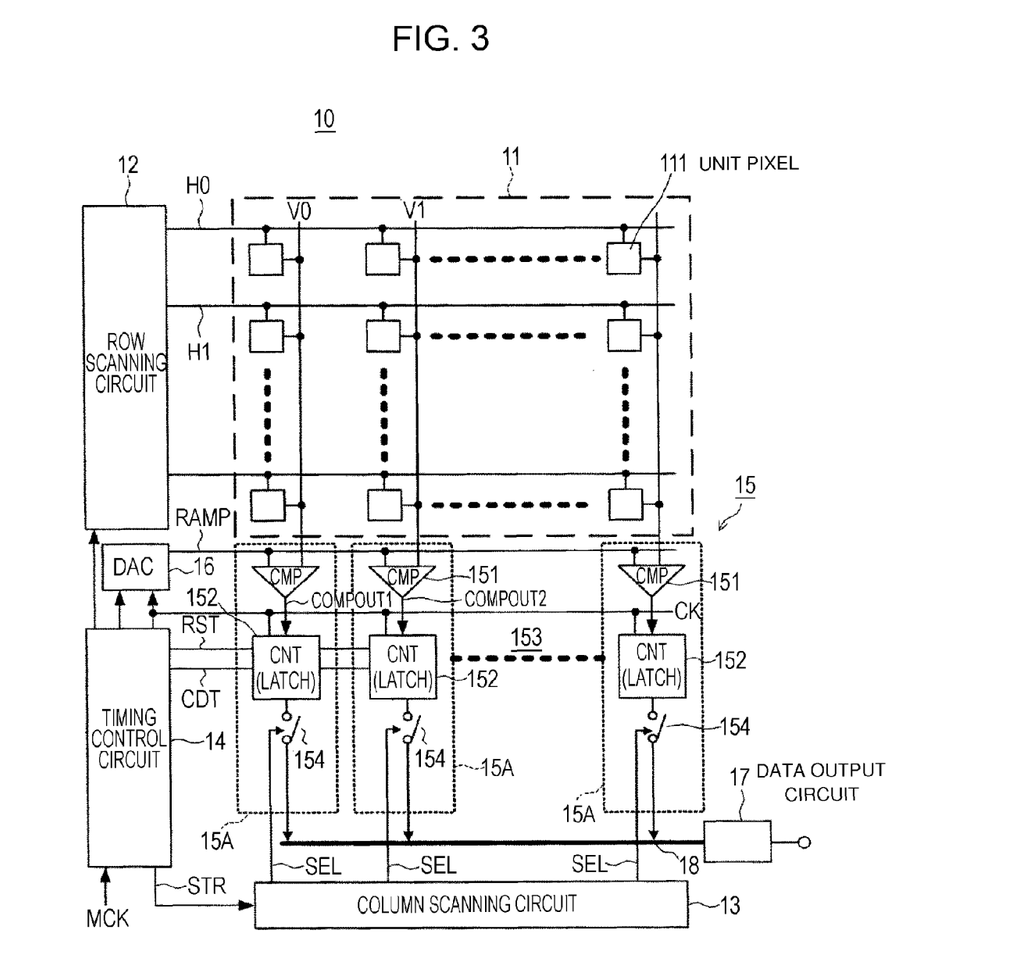
FIG. 3 is a block diagram illustrating a structure example of a solid-state image pickup device (CMOS image sensor) with column-parallel ADCs according to an embodiment of the present invention.

FIG. 3 is a block diagram illustrating a structure example of a solid-state image pickup device (CMOS image sensor) with column-parallel ADCs, which include a data transfer circuit, according to an embodiment of the present invention.

This solid-state image pickup device 10 includes a pixel array section 11 serving as an image pickup unit, a row scanning circuit 12, a column scanning circuit 13, a timing control circuit 14, an ADC group 15, a digital-to-analog converter circuit (hereinafter abbreviated as DAC (Digital-Analog converter) 16, and a data output circuit 17 including a sense amplifier circuit (S/A) and the like.

The pixel array section 11 is configured by arranging unit pixels 111, each including a photodiode and an intra-pixel amplifier, arranged in a matrix.

Also, in the solid-state image pickup device 10, the timing control circuit 14 for generating an internal clock, the row scanning circuit 12 for controlling row addresses and row scanning, and the column scanning circuit 13 for controlling column addresses and column scanning are arranged as control circuits for sequentially reading signals from the pixel array section 11.

The ADC group 15 includes ADCs (A/D converter circuits) 15A arranged for individual column lines V0, V1, . . . in a manner correlated with the individual columns of the pixel matrix. The ADCs 15A include (n+1) comparators (CMP) 151 each of which compares a ramp waveform RAMP, which is obtained by changing a reference voltage generated by the DAC 16 to be a stepped voltage, with an analog signal obtained for each row line H0, H1, . . . from the unit pixels 111 through the column line V0, V1, . . . , and counter latches (hereinafter called counters CNT) 152 each of which performs counting up (or counting down) in response to an output of the comparator 151 and a clock CK and has the function of holding a count value. Accordingly, a column-parallel ADC block 153 is configured.

The layout structure and function of the counters 152, memories, and the like in the ADCs 15A will be described in detail later.

Outputs of the individual counters 152 are connected via switches 154 to a data transfer signal line 18.

The data output circuit (digital-signal processing circuit) 17 including the sense amplifier circuit corresponding to the data transfer signal line 18 and a subtracting circuit is arranged on the data transfer signal line 18.

At an initial time, each counter 152 having a function as a holding circuit enters, for example, a counting up (or counting down) state, and performs reset counting. When an output COMPOUTi of a corresponding one of the comparators 151 is inverted, the counter 152 terminates a counting up operation, and the count value is held.

On this occasion, the initial value of the counter 152 is an arbitrary value of an AD-converted gradation level, such as 0. In this reset counting period, the counter 152 reads a reset component ΔV of the unit pixel 111.

Thereafter, the counter 152-2 enters a counting down (or counting up) state, and performs data counting in accordance with the intensity of incident light. When the output COMPOUTi of the corresponding comparator 151 is inverted, the count value in accordance with a comparison period is held.

The held count value is scanned by the column scanning circuit 13 and input as a digital signal to the data output circuit 17 via the data transfer signal line 18.

The column scanning circuit 13 is activated when, for example, a start pulse STR and a master clock MCK are supplied thereto, drives a corresponding selection line SEL in synchronization with a drive clock CK in accordance with the master clock MCK (with reference to MCK), and reads latch data of the counter 152 to the data transfer signal line 18.

In the solid-state image pickup device 10 with such a structure, the following processing is performed in one horizontal unit period (1H).

That is, in 1H, reading for the first time from the unit pixels 111 on an arbitrary row Hx to the column lines V0, V1, . . . is denoted by P-phase reading PR; comparison for the first time in the comparators 151 is denoted by P-phase comparison PC; reading for the second time is denoted by D-phase reading DR; comparison for the second time in the comparators 151 is denoted by D-phase comparison DC; and post-processing after the D-phase processing is denoted by D-phase post-processing DAP. These individual operations are consecutively performed.

Control of timing of the P-phase reading PR, the P-phase comparison PC, the D-phase reading DR, the D-phase comparison DC, and the D-phase post-processing DAP is performed by the timing control circuit 14.

Next, a specific structure and function of the counters 152 in the ADCs (AD converter circuits) 15A will be described.

The ADCs 15A according to the present embodiment are configured as integration-type AD converter circuits using the comparators 151 and the asynchronous counters 152.

Figure 4:
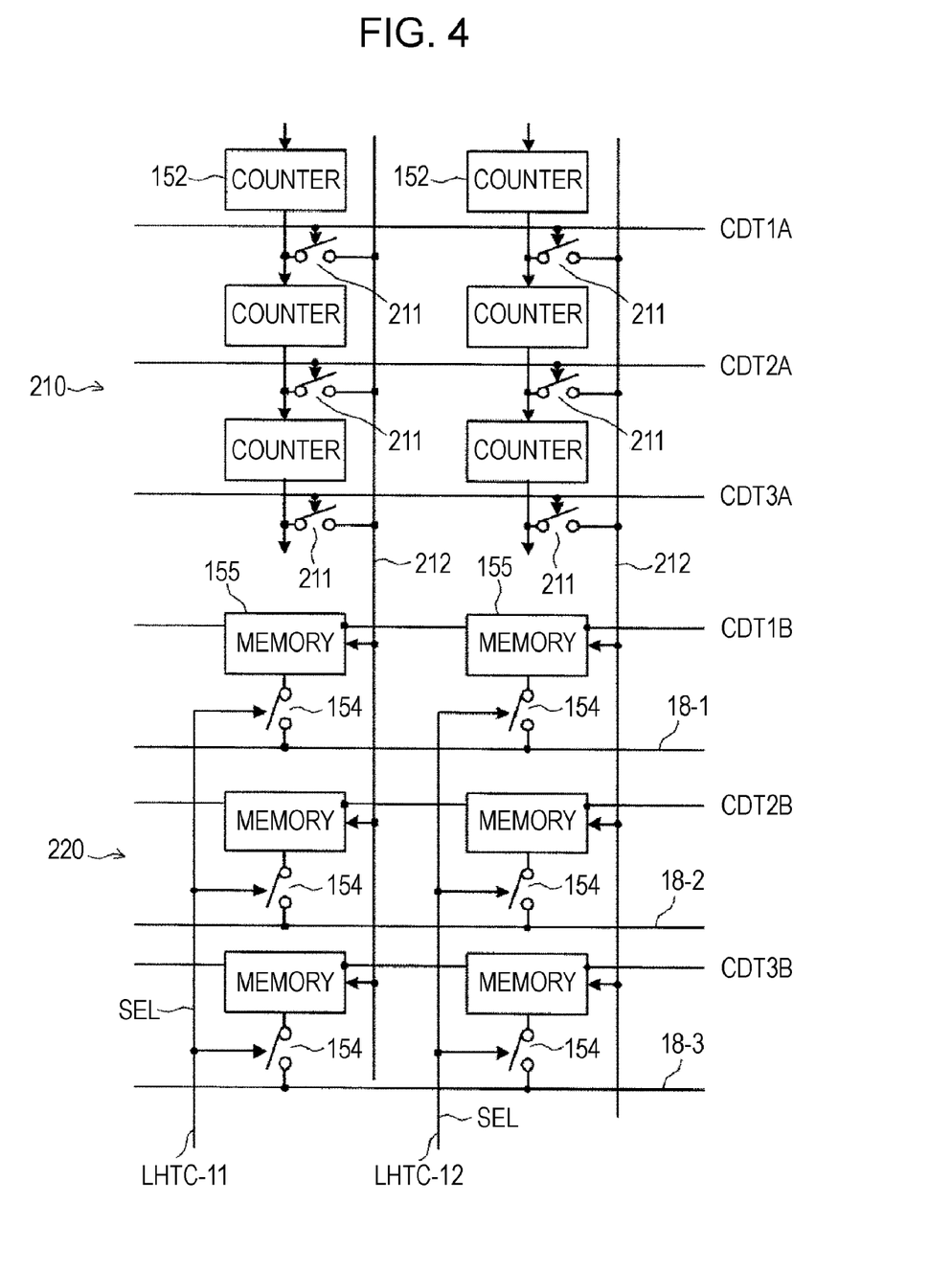
FIG. 4 is a diagram illustrating a first layout example of counters in ADCs according to the present embodiment.

FIG. 4 is a diagram illustrating a first layout example of counters in ADCs according to the present embodiment.

Figure 5:
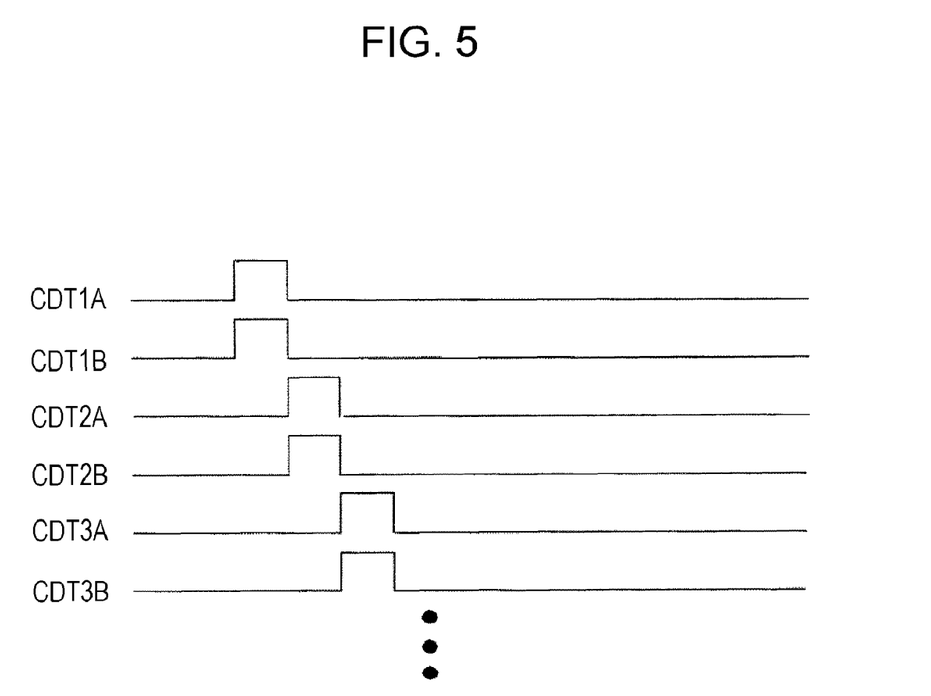
FIG. 5 is a timing chart of control signals in a circuit in FIG. 4.

FIG. 5 is a timing chart of control signals in a circuit in FIG. 4.

The counters 152 and memories 155 are, as illustrated in FIG. 4, organized into a counter group 210 and a memory group 220 on a column-by-column basis.

In each column, the individual counters 152 are cascade-connected between individual bits.

Switches 211 are provided at bit output portions of the individual counters 152, and connecting sides of the individual switches 211 are commonly connected to a column-signal transfer line 212.

In other words, output sides of the switches 111 are shared with the other individual bits.

The switches 211 are controlled to be turned on/off in response to intra-column first data transfer control signals CDT1A, CDT2A, CDT3A, . . . using the timing control circuit 14.

Additionally, inputs of the memories (latch circuits) 155, which store digital data for horizontal transfer, share the column-signal transfer line 212, as illustrated in FIG. 4.

Outputs of the memories 155 corresponding to the individual bits are connected via the switches 154 to data transfer signal lines 18-1, 18-2, 18-3, . . . wired so as to be orthogonal to the column-signal transfer line 212.

Transfer control of data from the individual memories 155 is performed in response to intra-column second data transfer control signals CDT1B, CDT2B, CDT3B, . . . using the timing control circuit 14.

Note that the switches 211 correspond to first switches, and the switches 154 correspond to second switches.

A method of transferring data from the counters 152 to the memories (latch circuits) 155 using this circuit can be performed as follows.

First, the first switches 211 at output portions of the counters 152, and the intra-column first data transfer control signals CDT1A, CDT2A, CDT3A, . . . and second data transfer control signals CDT1B, CDT2B, CDT3B, . . . , which are latch control pulses, are configured to be controllable by individual bits. Individual bits at the output side (counter) and the input side (memory, latch) form a pair, and a pair of control signals is pulse-controlled substantially at the same time, as illustrated in FIG. 5, and data is transferred.

On this occasion, other pairs of control signals are not driven, thereby preventing output collisions.

This is sequentially and separately performed on the other individual bits, whereby data is transferred from the counters 152 to the memories (latch circuits) 155.

Since transfer signals are shared on the column-signal transfer line 212, in terms of layout, the number of signals lines wired in the vertical direction is limited to the number of common signal transfer lines. Even in a layout region with an extremely narrow width in the horizontal direction, as in a column reading circuit in an image pickup apparatus, wiring can be done even when counters and latch circuits are laid out in completely separate regions, and additionally, desired driving results can be obtained.

Accordingly, the wiring length between individual counter bits, which is the problem discussed in the conventional example, can be suppressed. Low power consumption driving and the high-speed operation margin of the counters are improved.

Additionally, since the memories (latch circuits) are arranged in isolate regions, crosstalk noise to the data transfer signal lines 18, which is due to driving of the counters 152, can be significantly reduced.

Also, since the region is divided, the counter portion and the memory portion (latch circuit portion) can be separated from the well, and additionally the power supply and the ground GND can be separated from each other. Counter driving noise sneaking from the power supply and the ground GND can be reduced.

As a specific example, the method of transferring data from the counters 152 to the memories (latches) 155 has been described here. However, data transfer is not limited to that from the counters 152 to the memories (latches) 155, and includes a method of transferring data from a digital storage region to a digital storage region in each column, as in from a memory (latch) to a memory (latch). Also, this is effective as means for physically separating function circuits, in terms of noise and layout efficiency.

Figure 6:
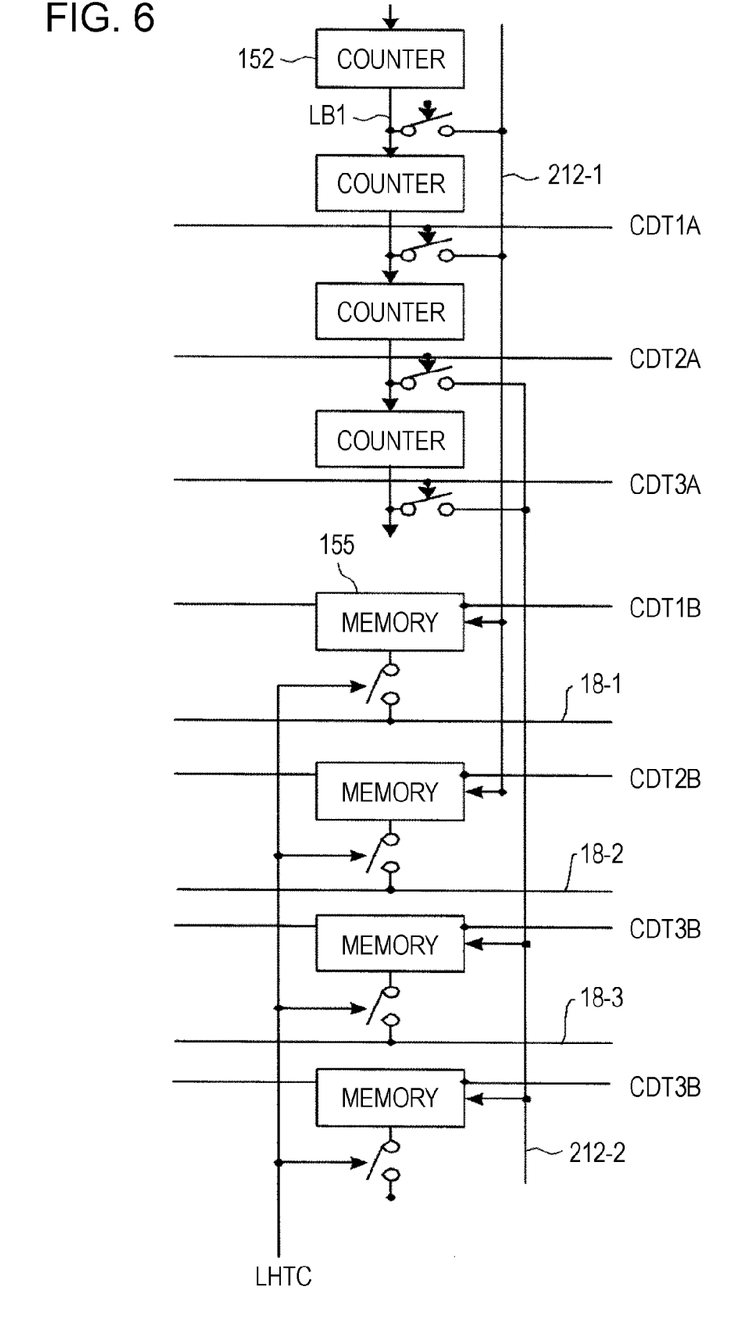
FIG. 6 is a diagram illustrating a second layout example of counters in ADCs according to the present embodiment.

FIG. 6 is a diagram illustrating a second layout example of counters in ADCs according to the present embodiment.

In the circuit in FIG. 4, the operation time involved in transferring data from a counter to a memory (latch) is required for the number of bits to be transferred.

Therefore, as illustrated in FIG. 6, the transfer time can be reduced by providing a plurality (two in the example in FIG. 6) of column-signal transfer lines within the allowable range of the layout region for the column-signal transfer lines, which are shared lines.

Figure 7:
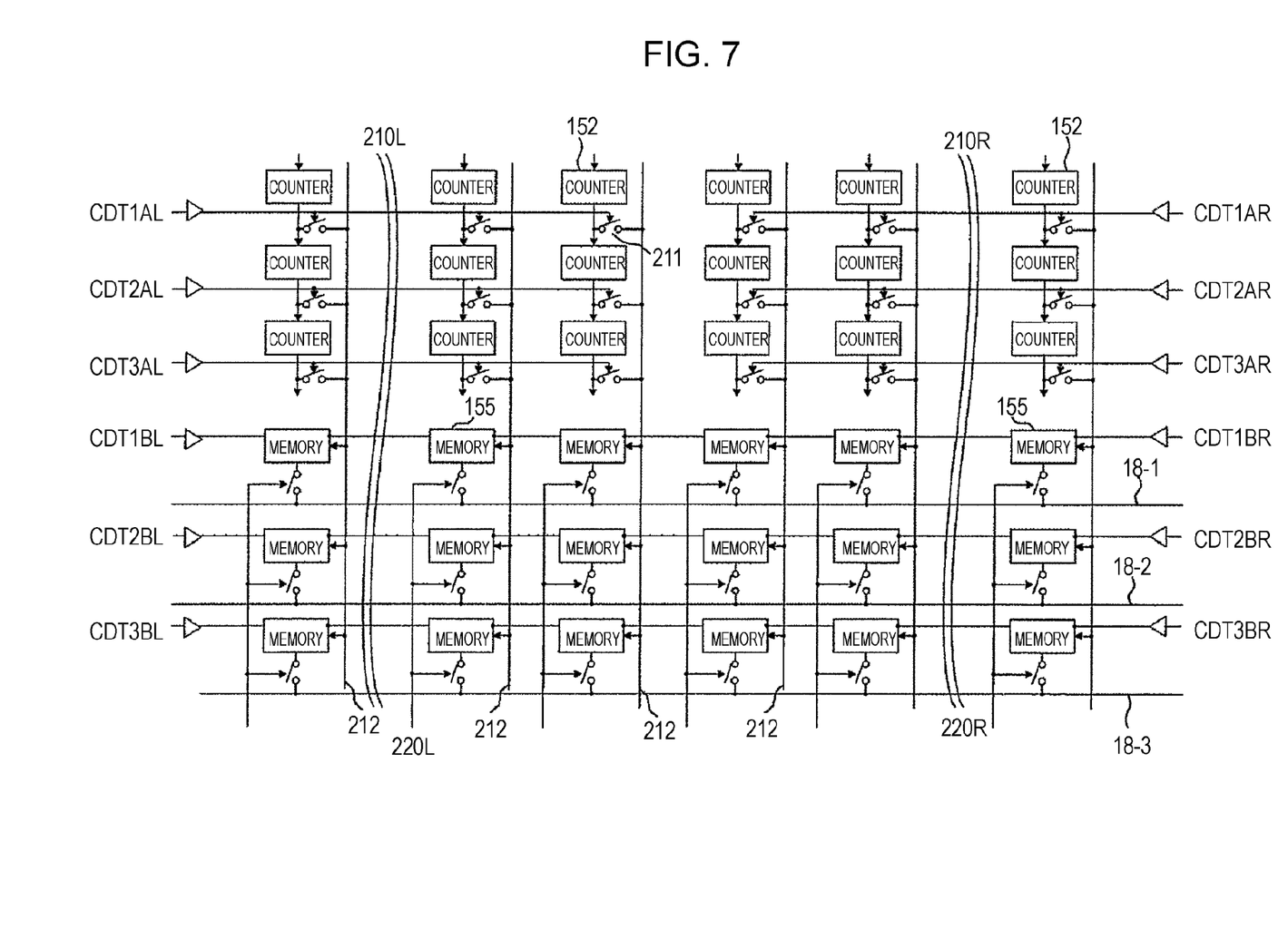
FIG. 7 is a diagram illustrating a third layout example of counters in ADCs according to the present embodiment.

FIG. 7 is a diagram illustrating a third layout example of counters in ADCs according to the present embodiment.

Figure 8:
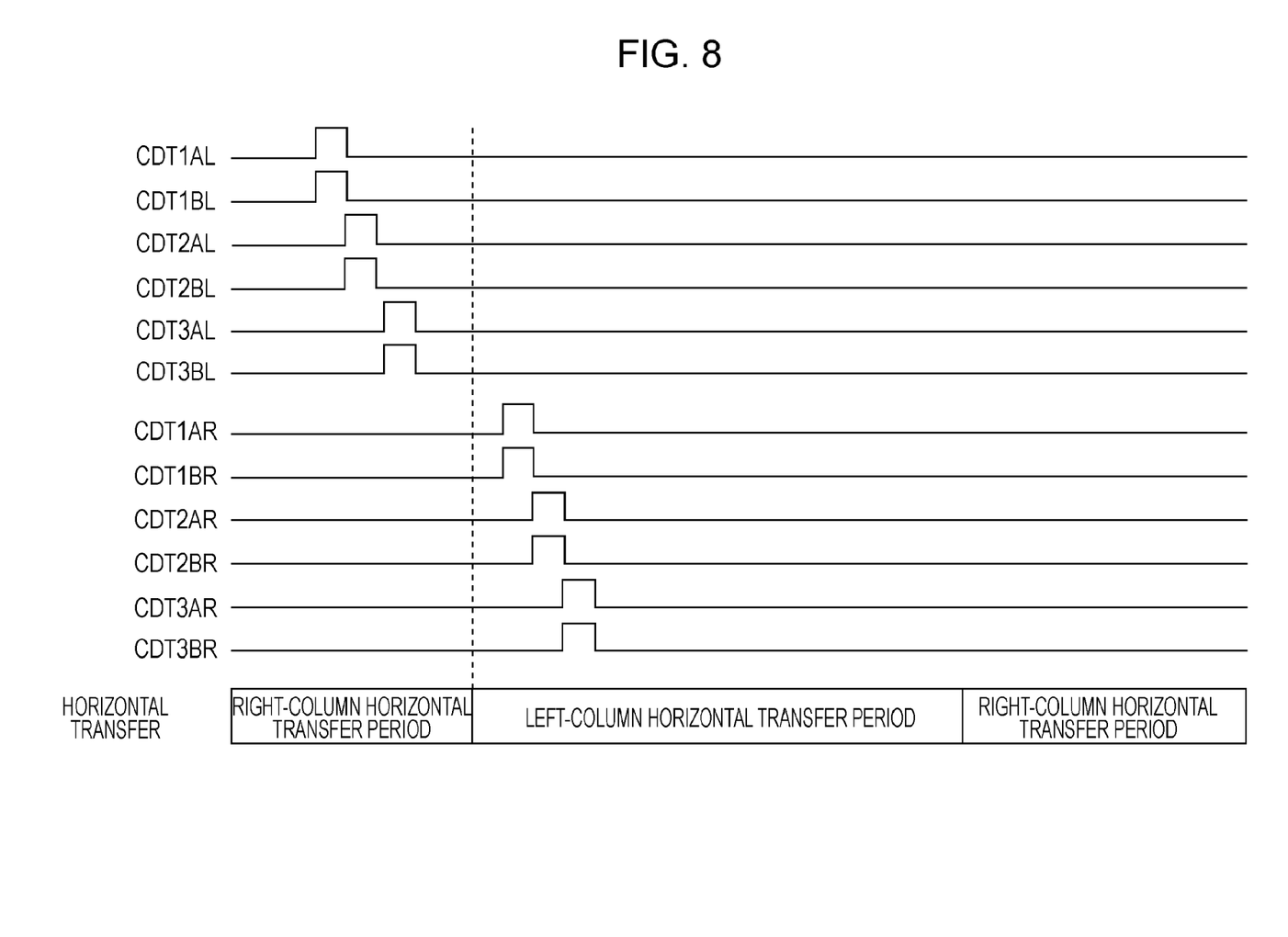
FIG. 8 is a timing chart of control signals in a circuit in FIG. 7.

FIG. 8 is a timing chart of control signals in the circuit in FIG. 7.

Also, this transfer period causes a problem in the entire reading circuit system because no horizontal transfer operation can be performed during this period.

When the horizontal transfer time is a rate-determining condition for the reading speed as an image pickup apparatus, the intra-column data transfer becomes a factor that limits the reading speed as an image pickup apparatus.

In order to solve this, a structure such as that illustrated in FIG. 7 can be adopted.

In this example, in the diagram, the counter group 210 is divided into a left counter group 210L and a right counter group 210R. Similarly, the memory group 220 is also divided into a left memory group 220L and a right memory group 220R.

The control signals which perform intra-column data transfer are separated into groups for the left and right blocks of the column circuit, and, as illustrated in FIG. 8, the intra-column data transfer control signals are controlled at different timings in the left and right blocks.

When it is assumed that columns in which data transfer begins are columns on the left side, left-side intra-column data transfer is performed first. Subsequently, right-side intra-column data transfer is completed before data transfer on the left side begins. In order to do so, transfer control signals are controlled with delays on the left and right sides.

Intra-column data transfer is performed first on the left side using data transfer control signals CDT1AL, CDT2AL, CDT3AL, . . . , and CDT1BL, CDT2BL, CDT3BL, . . . for the left columns.

Subsequently, intra-column data transfer is performed first on the right side using data transfer control signals CDT1AR, CDT2AR, CDT3AR, . . . , and CDT1BR, CDT2BR, CDT3BR, . . . for the right columns.

In this way, driving can be performed without having the intra-column data transfer period as a rate-determining condition for the reading speed as an image pickup apparatus.

FIGS. 9(A) and (B) includes diagrams illustrating yet other examples of the layout of counters in ADCs according to the present embodiment.

Figure 9:
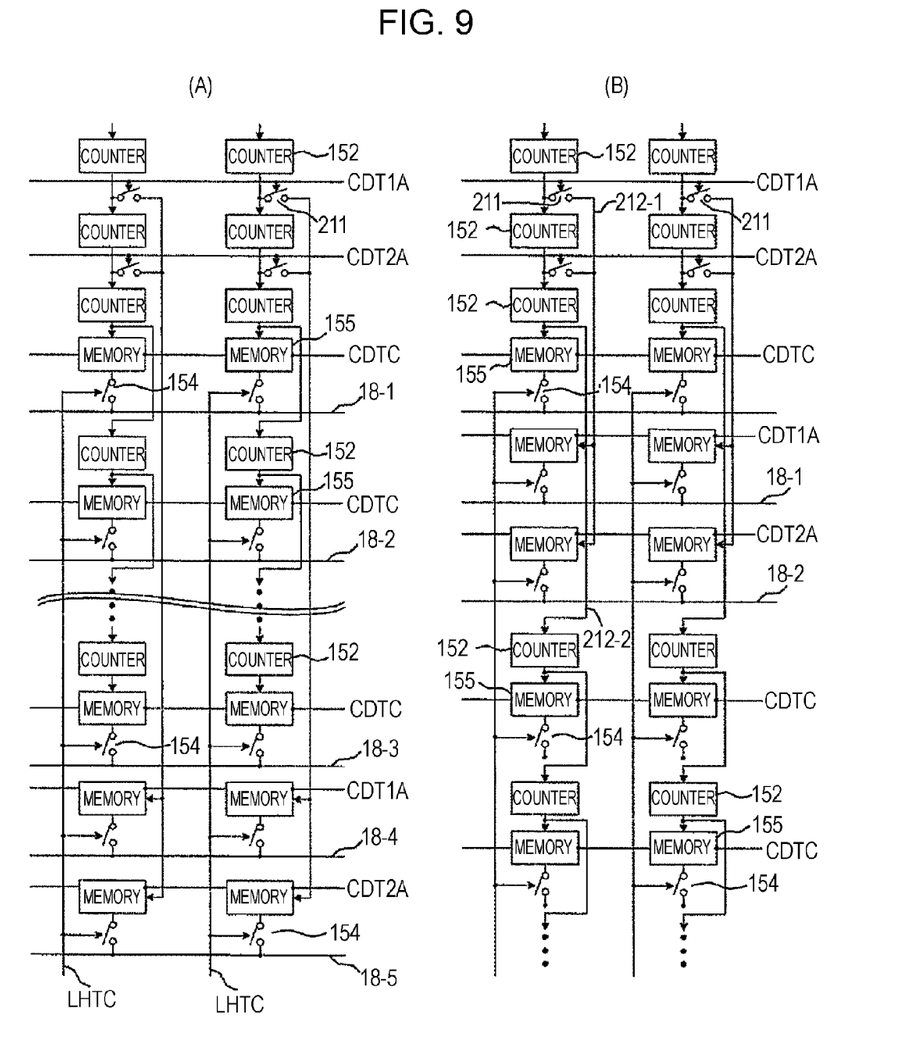
FIG. 9 includes diagrams illustrating yet other examples of the layout of counters in ADCs according to the present embodiment.
Figure 10:
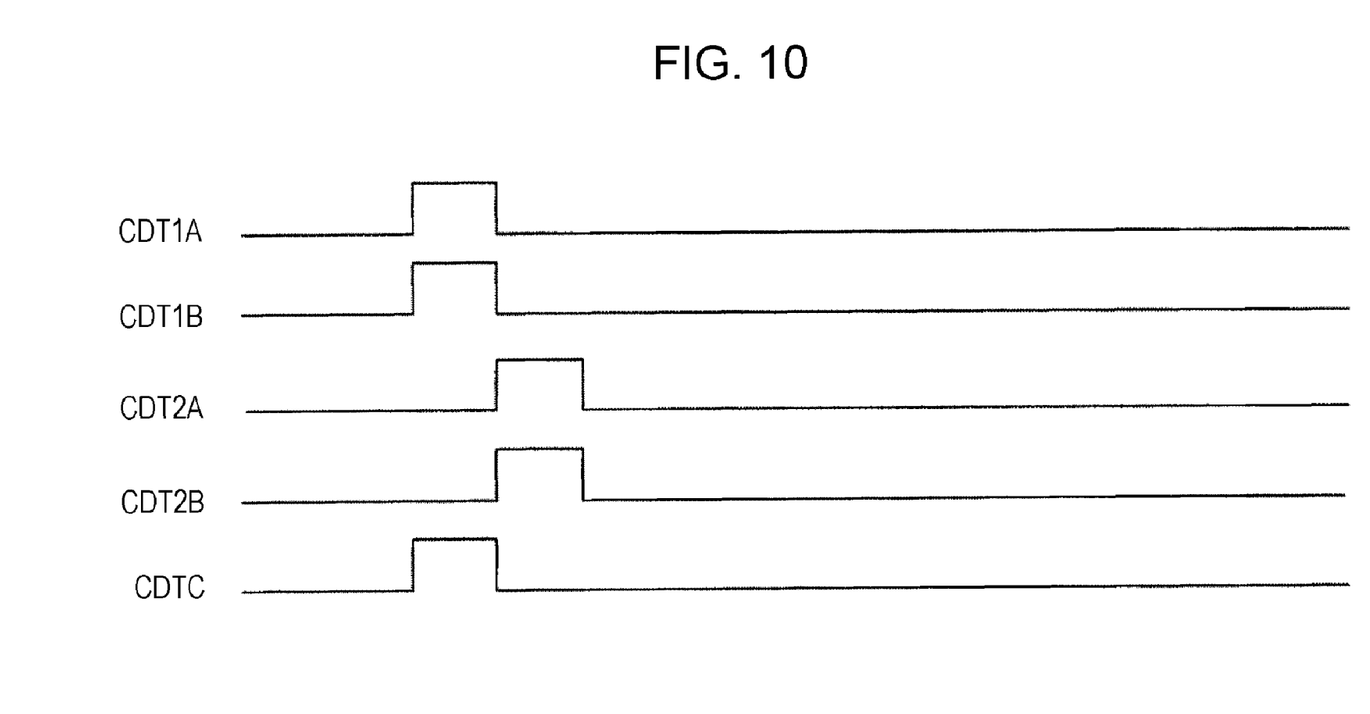
FIG. 10 is a timing chart of control signals in circuits in FIG. 9.

FIG. 10 is a timing chart of control signals in circuits in FIG. 9.

As a yet different method, a technique of, as illustrated in FIGS. 9(A) and (B), performing data transfer while providing memories in separate regions for a few bits on the LSB side, which have high driving frequencies and serve as main components of power consumption, and, for the MSB side, alternately placing the counters 152 and the memories 155 is effective for the above-described problem.

As illustrated in FIG. 9(A) and FIG. 9(B), a plurality of patterns are conceivable for places where the memories for the LSB side are arranged, such as at terminating positions of the counters and intermediate positions of the counters.

As illustrated in FIG. 10, vertical transfer control is reduced to handle a few bits on the LSB side, and, additionally, other memory transfer control (transfer control using the intra-column data transfer control signals CDTC) can be executed at the same timing, thus reducing the time involved in transfer.

Also, as has been described above, low power consumption is achieved, and the high-speed operation margin is improved. Note that, in this case, there exist portions in which the counters 152 and the data transfer signal lines, which are output portions of the memories 155, cross each other. This may cause counter noise to influence the horizontal transfer.

Here, the operation of the solid-state image pickup device (CMOS image sensor) 10 will be described.

After reading for the first time from the unit pixels 111 on an arbitrary row Hx to the column lines V0, V1, . . . becomes stable, the DAC 16 inputs a ramp waveform RAMP, which is obtained by temporally changing a reference voltage to be a stepped voltage, to each comparator 151. Comparison with a voltage of an arbitrary column line Vx is performed in a corresponding one of the comparators 151.

In parallel to inputting of the stepped wave having the ramp waveform RAMP, each counter 152 performs counting for the first time.

Here, an output of the comparator 151 is inverted when the RAMP voltage and the Vx voltage become equal. Accordingly, the count operation of the counter 152 is terminated, and a count value in accordance with the comparison time is held.

At the time of this reading for the first time, the counter 152 reads a reset component $\Delta V$ of the unit pixel 111. In the reset component $\Delta V$, noise differing from one unit pixel 111 to another unit pixel 111 is included as offset.

However, variations in the reset components $\Delta V$ are generally small. Also, since the reset level is common to all pixels, an output of an arbitrary column line Vx is roughly known in advance.

Therefore, at the time of reading the reset component $\Delta V$ for the first time, the comparison period can be shortened by adjusting the ramp waveform (RAMP) voltage. In this case, for example, $\Delta V$ is compared in a count period (128 clocks) corresponding to 7 bits.

In reading for the second time, besides the reset component $\Delta V$, a signal component in accordance with the intensity of incident light which is different for each unit pixel 111 is read, and an operation similar to that in reading for the first time is performed.

That is, after reading for the second time from the unit pixels 111 on an arbitrary row Hx to the column lines V0, V1, . . . becomes stable, the DAC 16 inputs a ramp waveform RAMP, which is obtained by temporally changing a reference voltage to be a stepped voltage, to each comparator 151. Comparison with a voltage of an arbitrary column line Vx is performed in a corresponding one of the comparators 151.

In parallel to inputting of the stepped wave having the ramp waveform RAMP, each counter 152 performs counting for the second time.

Here, an output of the comparator 151 is inverted when the RAMP voltage and the Vx voltage become equal. At the same time, a count value in accordance with the comparison time is held.

On this occasion, the count values obtained in counting for the first time and the second time are held at different places.

After the end of the foregoing AD conversion period, with the column scanning circuit 4, n-bit digital signals which are obtained for the first time and the second time and are held are transferred via the data transfer signal line 18 and detected at the data output circuit 17. After (signal for the second time)− (signal for the first time) is sequentially performed by the subtracting circuit, the difference is output to the outside. Thereafter, a similar operation is sequentially repeated for the individual rows, and a two-dimensional image is generated.

The foregoing operation is performed in one horizontal unit period (1H).

In 1H, reading for the first time from the unit pixels 111 on an arbitrary row Hx to the column lines V0, V1, . . . is denoted by P-phase reading PR; comparison for the first time in the comparators 151 is denoted by P-phase comparison PC; reading for the second time is denoted by D-phase reading DR; comparison in the comparators 151 is denoted by D-phase comparison DC; and post-processing after the D-phase processing is denoted by D-phase post-processing DAP. These individual operations are consecutively performed.

As has been described above, according to the present embodiment, the counters 152 are organized into the counter group 210 and the memory group 220 on a column-by-column basis. In each column, the individual counters 152 are cascade-connected between the individual bits. The switches 211 are provided at the bit output portions of the individual counters 152. The connecting sides of the individual switches 211 are commonly connected to the column-signal transfer line 212, and the output sides of the switches 211 are shared with the other individual bits. The switches 211 are controlled to be turned on/off in response to the intra-column data transfer control signals CDT1A, CDT2A, CDT3A, . . . using the timing control circuit 14. Additionally, the inputs of the memories (latch circuits) 155, which store digital data for horizontal transfer, share the column-signal transfer line 212. The outputs of the memories 155 corresponding to the individual bits are connected via the switches 154 to the data transfer signal lines 18-1, 18-2, 18-3, . . . wired so as to be orthogonal to the column-signal transfer line 212. Transfer control of data from the individual memories 155 is performed in response to the intra-column data transfer control signals CDT1B, CDT2B, CDT3B, . . . using the timing control circuit 14. Accordingly, the following advantageous effects can be achieved.

In an image pickup apparatus in which A/D conversion is performed using a column reading circuit, and digital data obtained thereby needs to be moved to another storage region different from A/D in the same column, a digital storage region can be wired so as to be isolated from other regions, although there is a layout constraint due to the narrow pitch of the column, and noise generated in one of these regions can be separated from that generated in other regions. Accordingly, low noise driving and stable operation can be expected.

Also, when the A/D circuit unit uses a high-speed driven circuit, such as a counter, by reducing the wiring length of a drive wire, low power consumption driving can be performed. Additionally, it is expected that the high-speed operation margin is improved.

The solid-state image pickup device with these advantageous effects is applicable as an image pickup device in a digital camera or a video camera.

Figure 11:
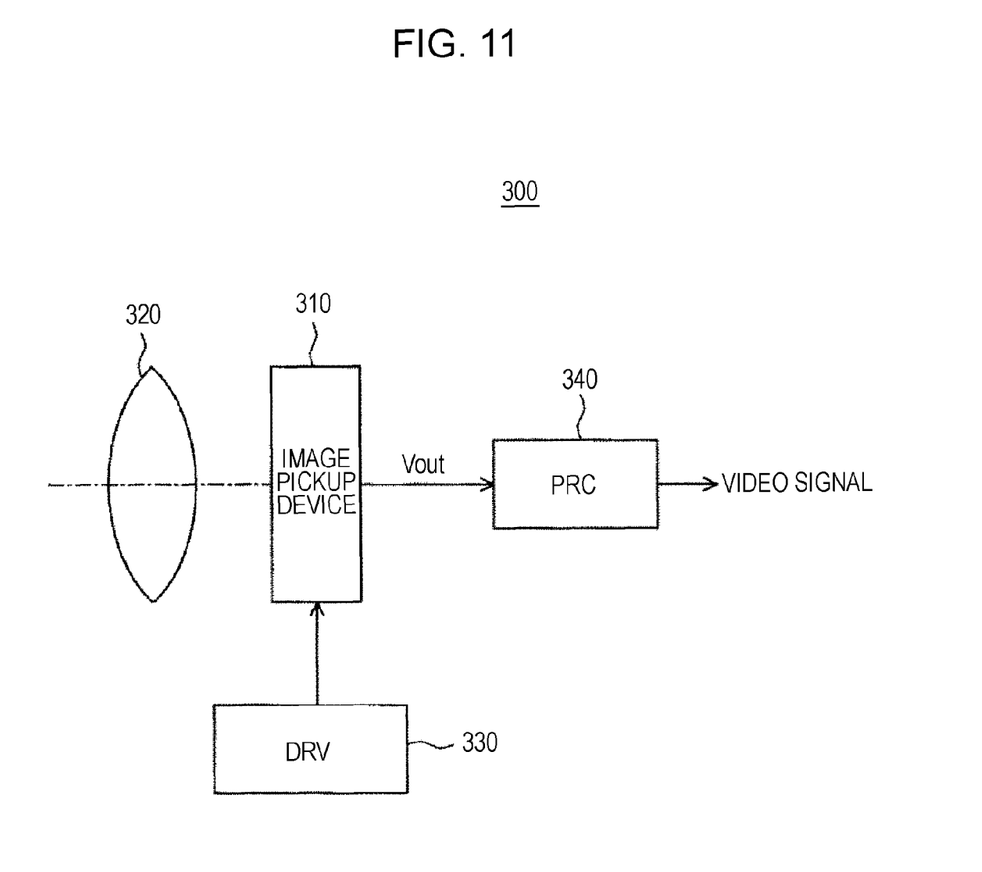
FIG. 11 is a diagram illustrating an example of the configuration of a camera system to which a solid-state image pickup device according to an embodiment of the present invention is applied.

FIG. 11 is a diagram illustrating an example of the configuration of a camera system to which a solid-state image pickup device according to an embodiment of the present invention is applied.

This camera system 300 includes, as illustrated in FIG. 11, an image pickup device 310 to which the solid-state image pickup device 10 according to the present embodiment is applicable, an optical system that directs incident light to a pixel region of the image pickup device 310 (that forms an image of a photographic subject), a lens 320 that forms an image from the incident light (image light) on an image pickup face, a drive circuit (DRV) 330 that drives the image pickup device 310, and a signal processing circuit (PRC) 340 that processes an output signal of the image pickup device 310.

The drive circuit 330 includes a timing generator (not shown in the drawings) that generates various timing signals including a start pulse that drives circuits in the image pickup device 310, and a clock pulse. The drive circuit 330 drives the image pickup device 310 using a predetermined timing signal.

Also, the signal processing circuit 340 applies signal processing, such as CDS (Correlated Double Sampling), to an output signal of the image pickup device 310.

An image signal processed in the signal processing circuit 340 is recorded on a recording medium, such as a memory. A hard copy of the image information recorded on the recording medium is generated using a printer or the like. Also, the image signal processed in the signal processing circuit 340 is displayed as a moving image on a monitor including a liquid crystal display or the like.

As has been described above, in an image pickup apparatus such as a digital still camera, by mounting the above-described image pickup device 10 as the image pickup device 310, a highly precise camera is realized.

What is claimed is:

1. A solid-state image pickup device comprising:
   (a) a pixel section including a plurality of pixels arranged in a matrix; and
   (b) a pixel-signal reading circuit that reads pixel signals from the pixel section,
   wherein,
      the pixel-signal reading circuit includes one or more comparators and one or more counters,
      each counter includes first switches provided at bit output portions of the counter,
      connecting output sides of the first switches are shared with other individual bits, and
      outputs of the counters corresponding to the individual bits are connected via second switches to data transfer signal lines.

2. The solid-state image pickup device according to claim 1, wherein the counters are arranged between the pixel section and the data transfer signal lines.

3. The solid-state image pickup device according to claim 1, further comprising a timing control unit which controls processing performed by the pixel-signal reading circuit, wherein:
   the timing control unit controls turning on/off of the first switches using first data transfer control signals, and controls transfer of data in the latches using second data transfer control signals, and
   a first data transfer control signal for a switch and a second data transfer control signal for a latch are supplied with the same timing, the switch and the latch being connected to output portions of a pair of counters.

4. The solid-state image pickup device according to claim 3, wherein the timing control unit performs data transfer control using the first data transfer control signals and the second data transfer control signals.

5. A camera system comprising:
   a solid-state image pickup device; and
   an optical system that forms an image on the solid-state image pickup device,
   wherein,
      the solid-state image pickup device includes (1) a pixel section including a plurality of pixels arranged in a matrix, and (2) a pixel-signal reading circuit that reads pixel signals from the pixel section,
      the pixel-signal reading circuit includes one or more comparators and one or more counters,
      each counter includes first switches at bit output portions of the counter,
      connecting output sides of the first switches are shared with other individual bits, and
      outputs of the counters corresponding to the individual bits are connected via second switches to data transfer signal lines.

6. The camera system according to claim 5, wherein the counters are arranged between the pixel section and the data transfer signal lines.

7. The camera system according to claim 5, further comprising a timing control unit that controls processing performed by the pixel-signal reading circuit,
   wherein,
      the timing control unitcontrols turning on/off of the first switches using first data transfer control signals, and controls transfer of data in the latches using second data transfer control signals, and
      a first data transfer control signal for a switch and a second data transfer control signal for a latch are supplied with the same timing, the switch and the latch being connected to output portions of a pair of counters.

8. The camera system according to claim 7, wherein the timing control unit performs data transfer control using the first data transfer control signals and the second data transfer control signals.

* * * * *